US009526159B2

(12) United States Patent
Suh

(10) Patent No.: US 9,526,159 B2
(45) Date of Patent: Dec. 20, 2016

(54) ROTATIONAL ANTENNA AND SEMICONDUCTOR DEVICE INCLUDING THE SAME

(75) Inventor: Kee Won Suh, Gyeonggi-do (KR)

(73) Assignee: ALLIED TECHFINDERS CO., LTD., Osan, Gyeonggi-Do (KR)

( * ) Notice: Subject to any disclaimer, the term of this patent is extended or adjusted under 35 U.S.C. 154(b) by 1186 days.

(21) Appl. No.: 12/919,711

(22) PCT Filed: Mar. 4, 2008

(86) PCT No.: PCT/KR2008/001236
§ 371 (c)(1),
(2), (4) Date: Aug. 26, 2010

(87) PCT Pub. No.: WO2009/107888
PCT Pub. Date: Sep. 3, 2009

(65) Prior Publication Data
US 2011/0000619 A1    Jan. 6, 2011

(30) Foreign Application Priority Data
Feb. 29, 2008 (KR) .................. 10-2008-0018791

(51) Int. Cl.
H01J 37/32  (2006.01)
C23C 16/507  (2006.01)
H05H 1/46  (2006.01)

(52) U.S. Cl.
CPC ............. *H05H 1/46* (2013.01); *C23C 16/507* (2013.01); *H01J 37/321* (2013.01); *H01J 37/32568* (2013.01); *H05H 2001/4667* (2013.01)

(58) Field of Classification Search
USPC ................................. 118/723 I; 156/345.48
See application file for complete search history.

(56) References Cited

U.S. PATENT DOCUMENTS

| 4,563,367 | A | * | 1/1986 | Sherman | H01J 37/32009 118/50.1 |
| 5,464,476 | A | * | 11/1995 | Gibb | H01J 37/321 118/718 |
| 5,565,738 | A | * | 10/1996 | Samukawa et al. | 315/111.51 |
| 5,669,975 | A | * | 9/1997 | Ashtiani | C23C 16/507 118/723 I |
| 6,028,285 | A | * | 2/2000 | Khater et al. | 219/121.43 |
| 6,447,635 | B1 | * | 9/2002 | Ra | H01J 37/321 118/723 AN |
| 7,744,721 | B2 | * | 6/2010 | Edamura et al. | 156/345.48 |

(Continued)

FOREIGN PATENT DOCUMENTS

| KR | 10 2002 0007155 A | 1/2002 |
| KR | 10 2006 0092427 | 8/2006 |

(Continued)

*Primary Examiner* — Karla Moore
(74) *Attorney, Agent, or Firm* — Hauptman Ham, LLP

(57) ABSTRACT

A rotational antenna and a semiconductor manufacturing device provided with the same are disclosed. The rotational antenna includes a plurality of coils connected in parallel to a high frequency power source and arranged at a regular interval around an axis in a symmetrical relationship with respect to the axis, wherein an electromagnetic field for generating inductively coupled plasma is uniformly formed when the coils are rotated about the axis.

7 Claims, 7 Drawing Sheets

(56) References Cited

U.S. PATENT DOCUMENTS

| | | | |
|---|---|---|---|
| 2003/0141285 A1* | 7/2003 | Tachino | H01J 37/321 219/121.54 |
| 2005/0103443 A1* | 5/2005 | Ishii | 156/345.48 |
| 2005/0145336 A1* | 7/2005 | Matsushima et al. | 156/345.34 |
| 2006/0191880 A1* | 8/2006 | Kwon et al. | 219/121.57 |

FOREIGN PATENT DOCUMENTS

| | | | |
|---|---|---|---|
| KR | 10 2007 0062708 A | | 6/2007 |
| KR | 2007062708 A | * | 6/2007 |

* cited by examiner

ROTATIONAL ANTENNA AND
SEMICONDUCTOR DEVICE INCLUDING
THE SAME

CROSS-REFERENCES TO RELATED
APPLICATIONS

This application is a U.S. national phase application, pursuant to 35 U.S.C. §371 of PCT/KR2008/001236, filed Mar. 4, 2008, designating the United States, which claims priority to Korean Application No. 10-2008-0018791, filed Feb. 29, 2008. The entire contents of the aforementioned patent applications are incorporated herein by this reference.

TECHNICAL FIELD

The present invention relates to a rotational antenna provided as a plasma source in semiconductor manufacturing devices, such as etching devices or deposition devices (including a plasma enhanced chemical vapor deposition device, a high density plasma chemical vapor deposition device and a plasma enhanced atomic layer deposition device), which are used to process a substrate using plasma (hereinafter, the term substrate is used to cover a wafer and an LCD glass substrate). And the present invention relates to a semiconductor manufacturing device having the rotational antenna as a plasma source.

BACKGROUND ART

Plasma sources for use in forming fine patterns on the surfaces of substrates have been developed into various shapes in view of the necessity of finely forming the line width of a circuit pattern in the field of semiconductors and in view of the necessity of increasing the size of a glass substrate in the field of LCDs made of glass substrates.

Typical examples of plasma sources for producing plasma in semiconductor manufacturing devices include a capacitively coupled plasma (CCP) source having a parallel plate geometry and an inductively coupled plasma (ICP) source using an antenna coil. The CCP source has been developed by Tokyo Electron Ltd., Japan and Lam Research Corp., U.S.A., and the ICP source has been developed by Applied Materials Technologies, Inc. and Lam Research Corp., U.S.A.

While the CCP source is advantageous in generating uniform plasma, an electromagnetic field has a direct influence on a substrate as a workpiece. Therefore, the electromagnetic field is apt to adversely affect the formation of a fine pattern on the workpiece. Furthermore, since the CCP source has plasma generation density smaller than that of the ICP source, the CCP source is disadvantageous in appropriately forming a pattern as a line width grows narrower. Moreover, as a high level of power is applied to the CCP source, severe damages may be caused to the workpiece and the semiconductor manufacturing device, which leads to increased manufacturing costs and difficulties.

On the other hand, the ICP source using an antenna coil to which high frequency power (or radio frequency power) is applied provides advantages in that it has an ability to generate plasma under a low pressure and enjoys an increased plasma generation density. However, the ICP source causes many problems to a substrate as a workpiece due to the non-uniform generation of plasma resulting inherently from the structure of the antenna. In the field of LCDs that makes use of glass substrates, the ICP source poses a problem in that plasma cannot be uniformly generated as the size of a glass substrate increases. Nevertheless, so long as uniformity is secured in the generation of plasma, the ICP source can serve as an excellent plasma source that can cope with the ultra-fineness of a circuit line width and the enlargement of a glass substrate. Thus, research has been keenly demanded for improving the structure of an antenna.

DISCLOSURE OF INVENTION

Technical Problem

In view of the problems posed in the conventional inductively coupled plasma source, it is an object of the present invention to improve the loss of an electromagnetic field inherent in the conventional antenna coil structure, which is designed to induce a voltage difference, and also to improve the non-uniformity in a plasma generation density inherent in the conventional fixed-type antenna coil structure.

Another object of the present invention is to provide an inductively coupled plasma source capable of attaining an uniform plasma density unrealizable in the conventional inductively coupled plasma source having a fixed-type antenna coil, capable of reducing a voltage difference generated in a workpiece to minimize the loss of a capacitive coupling electromagnetic field, and capable of minimizing a plasma generation space in a chamber to increase power use efficiency.

Technical Solution

According to one aspect of the present invention, there is provided a rotational antenna comprising a plurality of coils connected in parallel to a high frequency power source and arranged at a regular interval around an axis in a symmetrical relationship with respect to the axis, wherein an electromagnetic field for generating inductively coupled plasma is uniformly formed when the coils are rotated about the axis. In other words, the antenna coils are all rotated at a constant speed or a variable speed of from several rpm to several hundred rpm in order to improve the non-uniformity in the plasma generation density, whereby the inductively-coupled plasma with a uniform and high density that can comply with the process conditions is generated over a preset pressure range (of from several mTorr to several Torr).

In the rotational antenna recited above, the coils may comprise: a center coil applied with the high frequency power and serving as a rotation center axis; and a plurality of branch coils arranged at a regular interval around the center coil so that the branch coils are symmetrically disposed with respect to the center axis, and connected to the center coil at first ends thereof, each of the branch coils extending away from and then toward the center coil, the branch coils having grounding parts at second ends thereof. In other words, for the purpose of improving the conventional antenna coil structure that causes a voltage difference, the geometrical structure of the antenna coils is designed to ensure that the power input parts and the grounding parts are positioned adjacent to each other. This uniformly distributes the average voltage applied to the antenna coils and thus minimizes the loss of capacitatively-coupled electromagnetic fields.

In the rotational antenna recited above, each of the coils may be formed of a conductor pipe through which a coolant flows. As a consequence, the coils of the present invention enjoy optimized volume and occupying space and enhanced cooling performance, thereby making it possible to improve the lifespan and reliability of a device.

According to another aspect of the present invention, there is provided a semi-conductor manufacturing device comprising: a chamber for receiving a wafer, the chamber supplied with a reaction gas; and a rotational antenna including a plurality of coils connected in parallel to a high frequency power source and arranged at a regular interval around an axis in a symmetrical relationship with respect to the axis, wherein an electromagnetic field for generating inductively coupled plasma is uniformly formed when the coils are rotated about the axis.

In the semiconductor manufacturing device recited above, the coils may comprise a center coil applied with high frequency power and serving as a rotation center axis and a plurality of branch coils arranged at a regular interval around the center coil so that the branch coils are symmetrically disposed with respect to the center axis, the branch coils being connected to the center coil at first ends thereof to receive the high frequency power, the branch coils having grounding parts at second ends thereof, the grounding parts being arranged adjacent to the center coil.

In the semiconductor manufacturing device recited above, each of the center coil and the branch coils has a coolant path through which a coolant flows.

In the semiconductor manufacturing device recited above, the rotational antenna may be rotatably mounted to the outside or the inside of the chamber.

The semiconductor manufacturing device recited above may further comprise a rotator to which the rotational antenna is attached for unitary rotation with the rotator; and a housing for rotatably supporting the rotator.

In the semiconductor manufacturing device recited above, the housing may have a coolant supply part and a coolant discharge part, wherein the rotator has coolant channels through which a coolant is transferred to the rotational antenna, and wherein seals are provided between the coolant supply part and the coolant channel and between the coolant discharge part and the coolant channel.

In the semiconductor manufacturing device recited above, the coils may comprise a center coil applied with high frequency power and serving as a rotation center axis and a plurality of branch coils arranged at a regular interval around the center coil, the center coil being electrically insulated from the rotator, the branch coils having grounding parts at distal ends thereof, the grounding parts being grounded in contact with the rotator.

In the semiconductor manufacturing device recited above, the high-frequency power source has a frequency of from several hundred KHz to several hundred MHz.

The semiconductor manufacturing device recited above may further comprise a gas supply plate having gas grooves and gas holes formed in a radial direction and a circumferential direction for uniform injection of the reaction gas.

In the semiconductor manufacturing device recited above, a substantially constant average voltage is applied to the coils along a direction extending away from a starting point about which the coils make rotation.

Advantageous Effects

The present invention improves the conventional antenna coil structure provided in an inductively coupled plasma source and designed to generate a voltage difference, thereby minimizing the loss of a capacitive coupling electromagnetic field which would occur due to a voltage drop. Furthermore, the present invention can accomplish a uniform plasma density distribution by rendering an antenna coil rotatable in an effort to improve the non-uniformity in a plasma density distribution which would occur in the conventional fixed-type antenna coil.

As a consequence, the present invention minimizes the plasma generation space in the conventional antenna coil and maximizes the radio frequency power transfer efficiency. In addition, the present invention makes it easy to change or modify the geometric structure of an antenna coil even within a limited space, which assists in increasing a plasma density and making a plasma generation density uniform.

BEST MODE FOR CARRYING OUT THE INVENTION

Hereinafter, embodiments of the present invention will be described in detail with reference to the accompanying drawings. In this regard, it is to be understood that the sizes and the shapes of the components shown in some of the drawings are illustrated in an exaggerated scale for the sake of clarity in explanation. Furthermore, the terms specifically defined herein in consideration of the construction and function of the present invention may have different meanings depending on the intention of a user or operator and the practice in the art. The definitions of these terms shall be construed in terms of the whole description given in this specification.

The present invention is directed to a plasma source for a large-area workpiece which can be used in processing a circular substrate. Further, the present invention pertains to a plasma source having enhanced adaptability for the size of the circular substrate and, in particular, suitable for use in a semiconductor manufacturing process in which a wafer is used as a workpiece. More particularly, the present invention is concerned with an inductively coupled plasma source for use in deposition devices (including PECVD, HDPCVD and PEALD devices), etching devices (including ashing devices) and the like, which are designed to process a substrate using plasma. The inductively coupled plasma is capable of generating plasma by itself.

The plasma source according to the present invention is not bound by the area of a workpiece and therefore has improved adaptability. Therefore, the present plasma source can be suitably used in processing a glass substrate for an LCD or a carbon nanotube (CNT). The radio frequency power supplied from a high frequency power source (a radio frequency power source) to a single electrode through an impedance matcher is connected to at least two parallel antenna coils. The antenna coils are rotated at a speed of several rpm to several hundreds rpm to generate plasma.

The present invention provides an inductively coupled plasma source that allows a user to increase the length of the antenna coils or to easily change the geometric shape of the antenna coils in conformity with the size of a substrate as a workpiece. The inductively coupled plasma source is positioned above a deposition device or an etching device.

Figure 1:
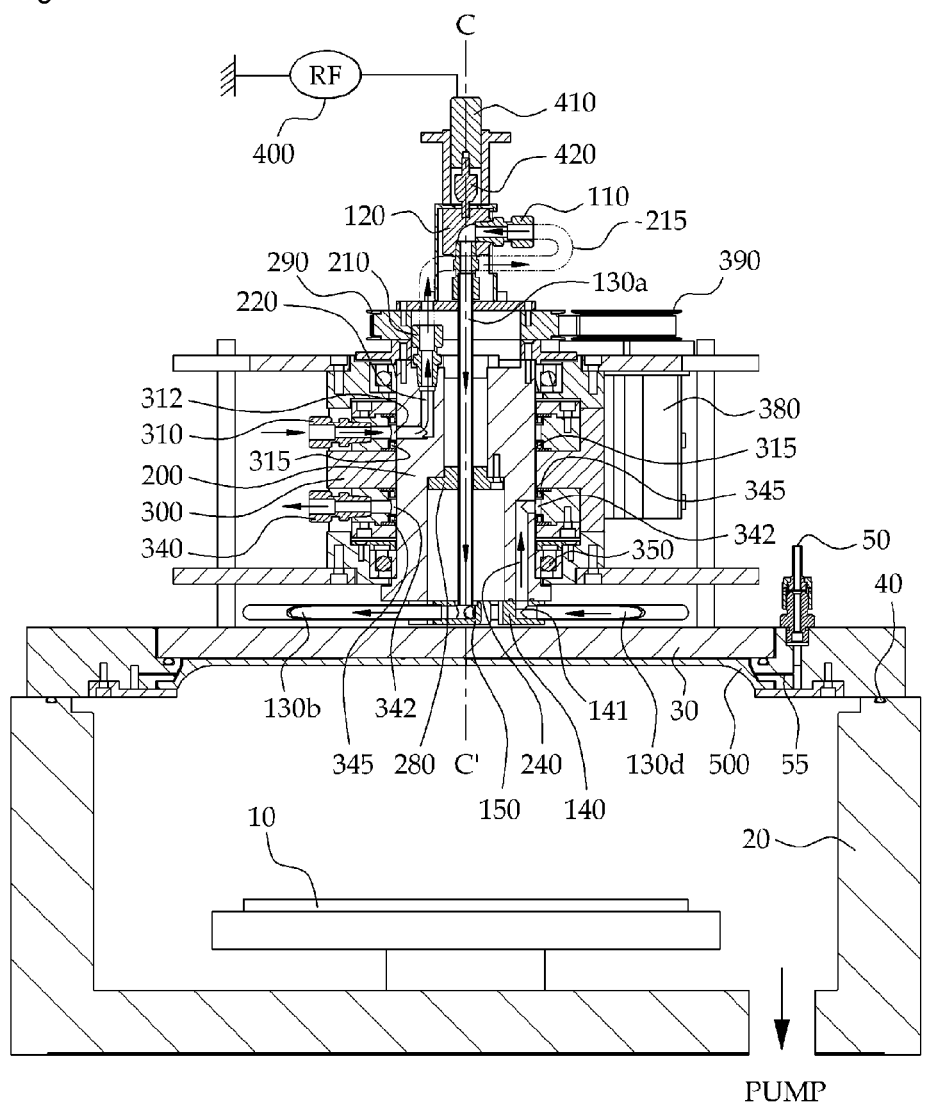
FIG. 1 is a side sectional view showing a semiconductor manufacturing device having a rotational antenna according to the present invention.
Figure 2:
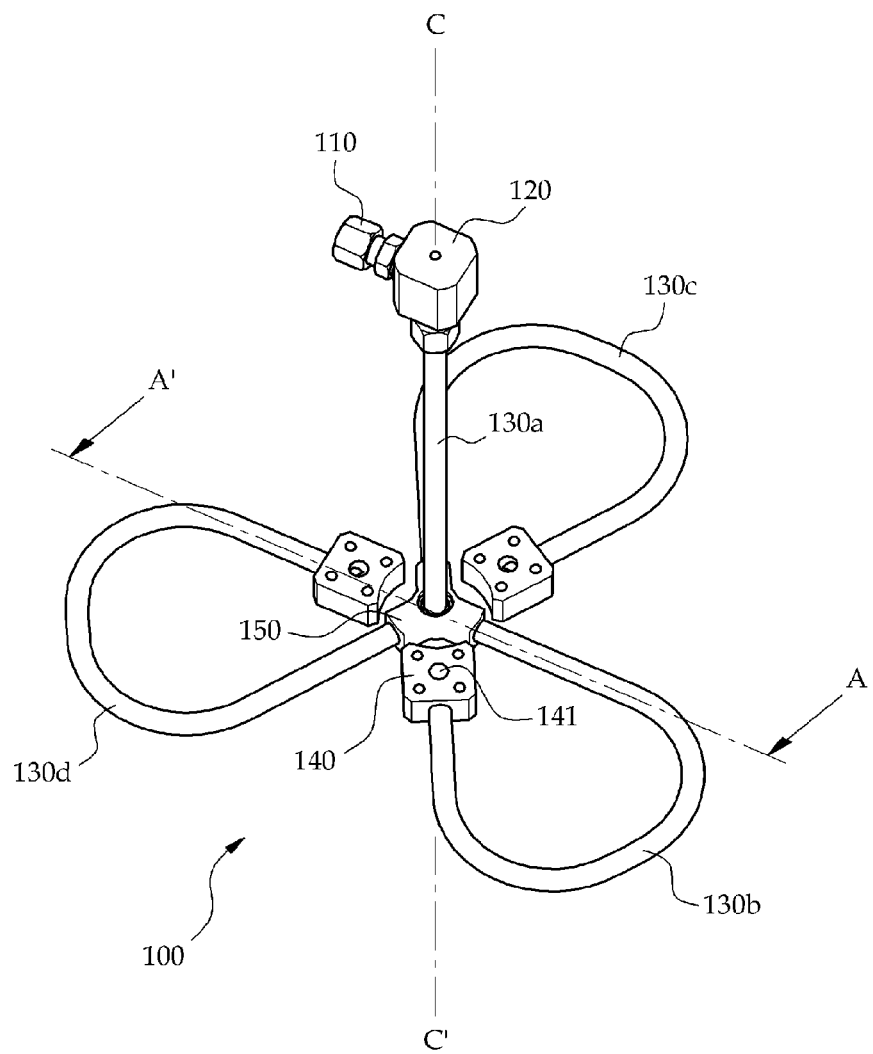
FIG. 2 is a perspective view showing a rotational antenna in accordance with one embodiment of the present invention.

FIG. 1 is a side sectional view showing a semiconductor manufacturing device having a rotational antenna according to the present invention. FIG. 2 is a perspective view showing a rotational antenna in accordance with one embodiment of the present invention. The structures and functions of a rotational antenna and a semiconductor manufacturing device having the same according to the present embodiment will be described in detail with reference to FIGS. 1 and 2.

In the upper part of a chamber 20, there are provided a rotational antenna 100 serving as a plasma source, a rotator 200 to which the rotational antenna 100 is mounted, and a housing 300 for rotatably supporting the rotator 200. The lower part of the chamber 20 is connected to a pump so that vacuum can be introduced into the chamber 20. An O-ring 40 is placed on the upper end of the chamber 20 which in turn is covered and sealed by a cover 30. Preferably, the cover 30 is formed of a quartz glass plate. A substrate 10 and a gas supply plate 500 for uniformly supplying a reaction gas are located in the chamber 20. The reaction gas is excited into a plasma state by virtue of the plasma source arranged above the chamber 20.

As an alternative embodiment not illustrated in the drawings, it would be conceivable that the rotational antenna and the rotator are arranged within the chamber. In this case, the housing positioned outside the chamber and the rotator positioned inside the chamber need to be sealed off from each other so that the internal space of the chamber can be maintained under a vacuum condition. This is because the housing provided with a coolant supply part and a coolant discharge part is desirably arranged outside the chamber, As will be further described later with reference to FIGS. 6 through 8, a reaction gas such as an argon (Ar) gas or the like, which is suitable for activating plasma, is evenly introduced into the chamber 20 from the outside of the plasma source via a gas inlet 50, a gas channel 55 and the gas supply plate 500.

High frequency power is supplied from a high frequency power source 400 to the rotational antenna 100 through a high frequency power connection part 410 having, e.g., an impedance matcher, and then a slip ring 420. The electromagnetic field induced in the rotational antenna 100 passes through the cover 30 made of quartz glass plate and is excited in the chamber 20 to generate plasma. The substrate 10 placed on a substrate support is processed by the plasma. At this time, radio frequency power of several hundreds KHz to several hundreds MHz can be employed.

As is apparent in the above description, the most significant difference between the conventional inductively coupled plasma source and the present inductively coupled plasma source resides in that the rotational antenna 100 is provided in the present invention. The feature of the present invention resides in rotating a coil, which feature is to uniformly generate plasma in a circumferential direction and cannot be realized in the conventional inductively coupled plasma source having a fixed antenna coil. The rotational antenna 100 is mounted to the rotator 200 with an insulation member 280 interposed therebetween and is rotated together with the rotator 200. The rotator 200 assembled to the rotational antenna 100 is rotatably fitted into the housing 300. Bearings 350 are interposed between the rotational contact surfaces of the housing 300 and the rotator 200. A motor 380 is attached to the housing 300. The motor 380 and the rotator 200 are operatively connected to each other by means of a belt and belt pulleys 290 and 390. Upon operating the motor 380, a rotational force or torque is applied to the rotator 200 and the rotational antenna 100. Since the high frequency power connection part 410 needs to be rotated together, the slip ring 420 is used to transmit the radio frequency power.

In one embodiment of the present invention, the antenna is composed of a center coil 130a which defines a rotation center and three branch coils 130b, 130c and 130d which are connected in parallel to the center coil 130a. The branch coils 130b, 130c and 130d have a partially opened loop shape such as a U-like shape or a C-like shape so that the proximal ends thereof connected to the center coil 130a and the distal ends thereof with grounding parts 140 can be arranged substantially at the same axial position. A connector 150 is used for assembling the branch coils 130b, 130c and 130d and the center coil 130a together.

A power input part 120, which is connected to the high frequency power source 400 through the slip ring 420, is provided at the distal end of the center coil 130a. The distal ends of the branch coils 130b, 130c and 130d having the grounding parts 140 come into contact with the rotator 200 so that they can be grounded.

The coolant, which is supplied through a coolant supply part 310 of the housing 300, is introduced into a coolant channel 220 via a groove 312 defined between the rotational contact surfaces of the housing 300 and the rotator 200.

The coolant introduced into the coolant channel 220 reaches a coolant connection part 210. Since the rotator 200 is grounded and the high frequency power from the high frequency power source 400 is applied to the center coil 130a, the coolant connection part 210 and the coolant inlet 110 of the center coil 130a are connected to each other by an insulation hose 215 for the purpose of insulation.

In order to ensure that the coolant can flow through the coils and the high frequency power from the high frequency power source 400 can be transmitted through the coils, it is preferred that the coils include conductor pipes. While the coolant may not flow through the coils, use of the coolant is desirable to prevent heat loss which would otherwise occur when the radio frequency power is applied to the coils. The coolant, which enters the coolant inlet 110, flows via the center coil 130a to the respective branch coils 130b, 130c and 130d connected in parallel to the center coil 130a, and is then discharged through the coolant outlets 141 formed in the grounding parts 140.

Inasmuch as the grounding parts 140 come into contact with and rotate together with the rotator 200, the coolant outlets 141 of the grounding parts 140 are connected to a coolant channel 240 which is formed in the rotator 200. Thus, the coolant discharged through the branch coils 130b, 130c and 130d are introduced into the coolant channel 240 through the coolant outlets 141 and is allowed to flow toward the coolant discharge part 340 via a groove 342 which is sealed by a seal 345. The grooves 312 and 342 are defined in the housing 300 to extend in the circumferential direction. The grooves 312 and 342 are respectively sealed by seals 315 and 345 which are structured not to hinder rotation of the rotator 200 relative to the housing 300. The supply and discharge paths of the coolant are indicated by arrows in FIG. 1.

Figure 3:
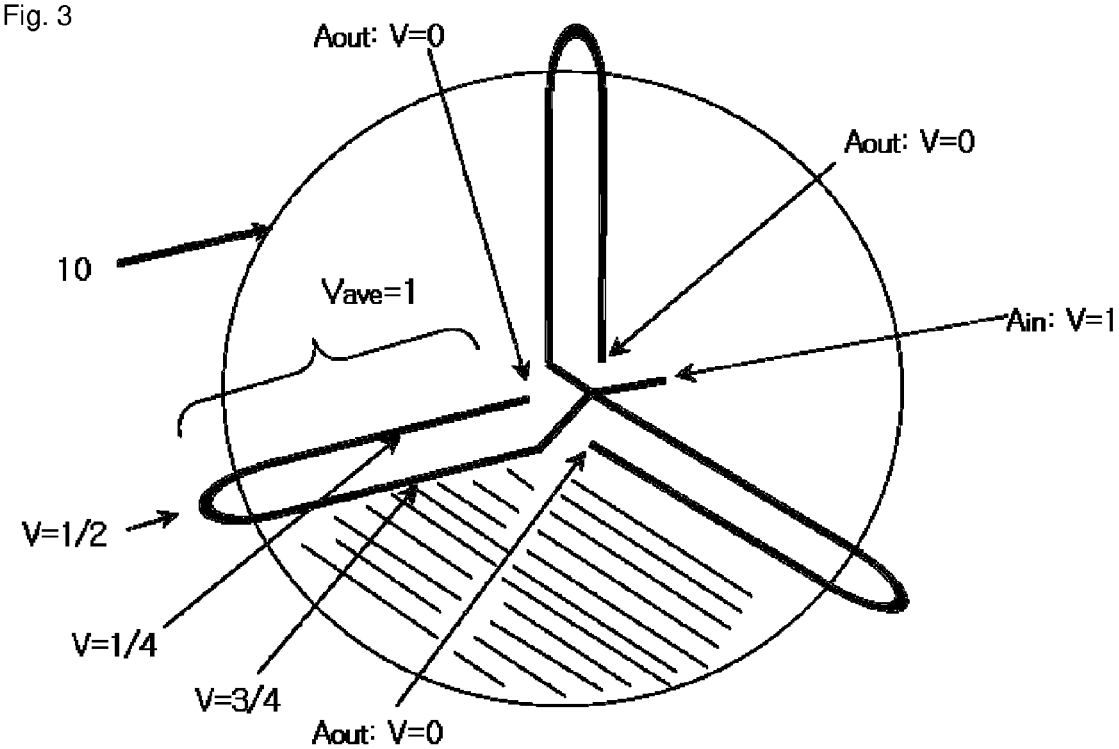
FIG. 3 is a schematic diagram of the rotational antenna shown in FIG. 2.

FIG. 3 is a schematic diagram of the rotational antenna shown FIG. 2. Referring to FIGS. 2 and 3, another feature of the rotational antenna 100 according to the present invention resides in that the power input part 120 and the grounding parts 140 are arranged substantially coaxially. When viewed from an imaginary line C-C in FIG. 2, which is an axis of the rotational antenna 100, the voltage of the center coil 130a is, for example, V, and the voltage of the grounding parts 140 positioned near the imaginary line C-C is 0. Also, in each of the branch coils 130b, 130c and 130d, an average voltage, which corresponds to the sum of the voltages applied to the two portions of each coil at any position along a radial direction, is constant as V. The term "radial direction" used herein means a direction which is extending away from a starting point about which the antenna 100 make rotation and is perpendicular to the center coil 130a. For example, in FIG. 2, the radial direction indicates a direction that extends from the center coil 130a toward the reference characters A and A'. Therefore, in the present invention, the difference in voltages applied to the coils can be minimized because the power input part 120 is arranged coaxially with respect to the center coil 130a and the grounding parts 140 are located at positions adjacent to the center coil 130a, Referring to FIG. 3, in the three branch coils which are flexed into a U-like shape and have the proximal ends and the distal ends adjoining to one another, a voltage drop occurs if a radio frequency input voltage of 1 is applied to the point $A_{in}$ where the branch coils are connected to the center coil. Therefore, voltages V at the points $A_{out}$ as grounding points become 0. Also, in each of the branch coils, each of which is composed of two strands, if the voltage applied to one strand thereof is ¼, the voltage applied to the other is ¾. The sum of the voltages applied to the two strands of each branch coil becomes 1. Moreover, since the voltages applied to the two strands are ½ in the radial outermost point of each branch coil, the average voltage becomes 1.

From the standpoint of the substrate 10 as a workpiece placed below the coils, there is provided an effect that the average voltage $V_{ave}=1$ is uniformly applied by the branch coils 130b, 130c and 130d to the substrate 10 along the radial direction. This helps minimize the voltage difference would occur in the conventional antenna structure. This is because the branch coils 130b, 130c and 130d have a U-like or C-like shape such that the power input part 120 and the grounding parts 140 can be arranged substantially coaxially.

In the conventional fixed-type antenna coil, empty spaces (such as the one hatched in FIG. 3) exist between coils. Therefore, the plasma density is non-uniformly distributed in these spaces when high frequency power is applied. In contrast, since the coil assembly is rotated to offset the empty spaces in the present invention, voltage differences resulting from the presence of the empty spaces (see FIG. 3) between the branch coils 130b, 130c and 130d can be cancelled with one another.

Hence, in the inductively coupled plasma source according to the present invention wherein the branch coils 130b, 130c and 130d have the U-like or C-like shape such that the power input part 120 and the grounding parts 140 can be arranged substantially coaxially, uniform plasma distribution can be obtained in both the radial direction and the circumferential direction, which feature cannot be realized in the conventional inductively coupled plasma source.

The uniform plasma distribution helps reduce the volume of the chamber 20. Even when the size of the substrate 10 is enlarged, the uniform plasma distribution can be attained only by increasing the length of the U-like or C-like coils. Therefore, the present invention can be easily adapted for the next-generation wafers having a diameter of 300 mm, 450 mm or over.

Figure 4:
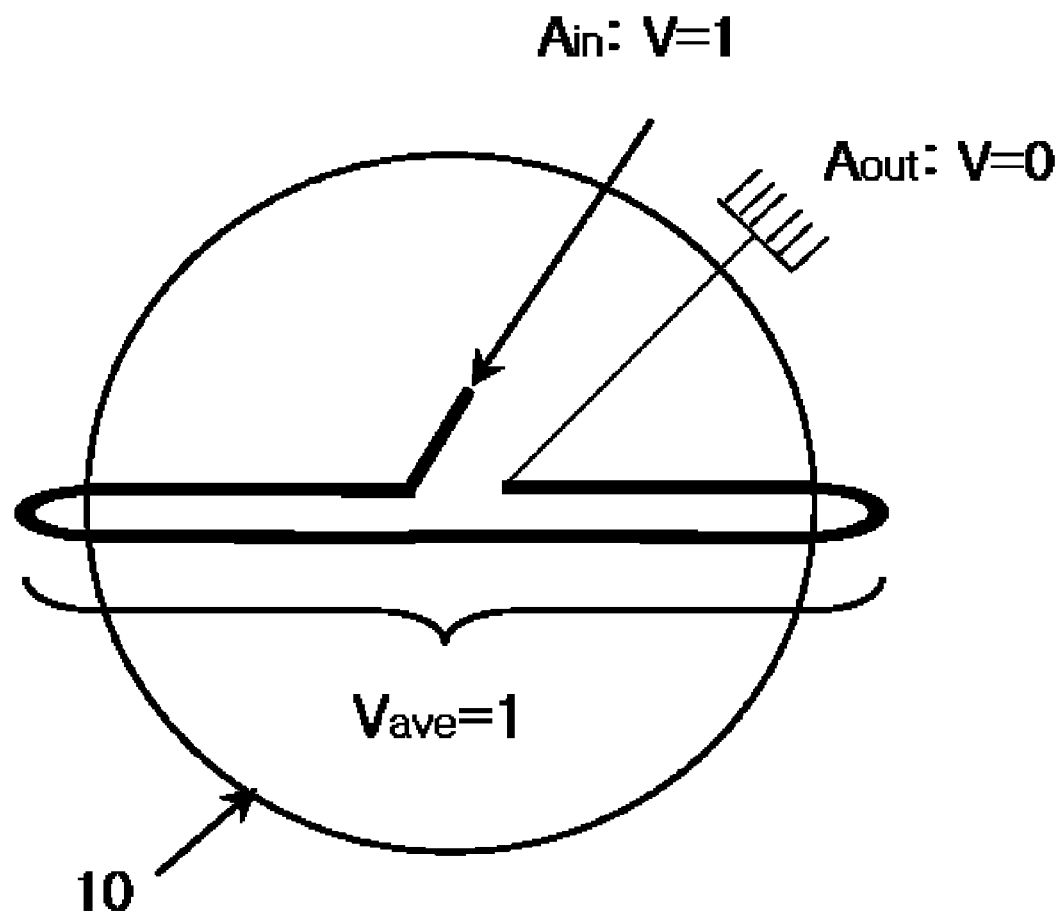
FIG. 4 is a schematic diagram illustrating a rotational antenna in accordance with another embodiment of the present invention.
Figure 5:
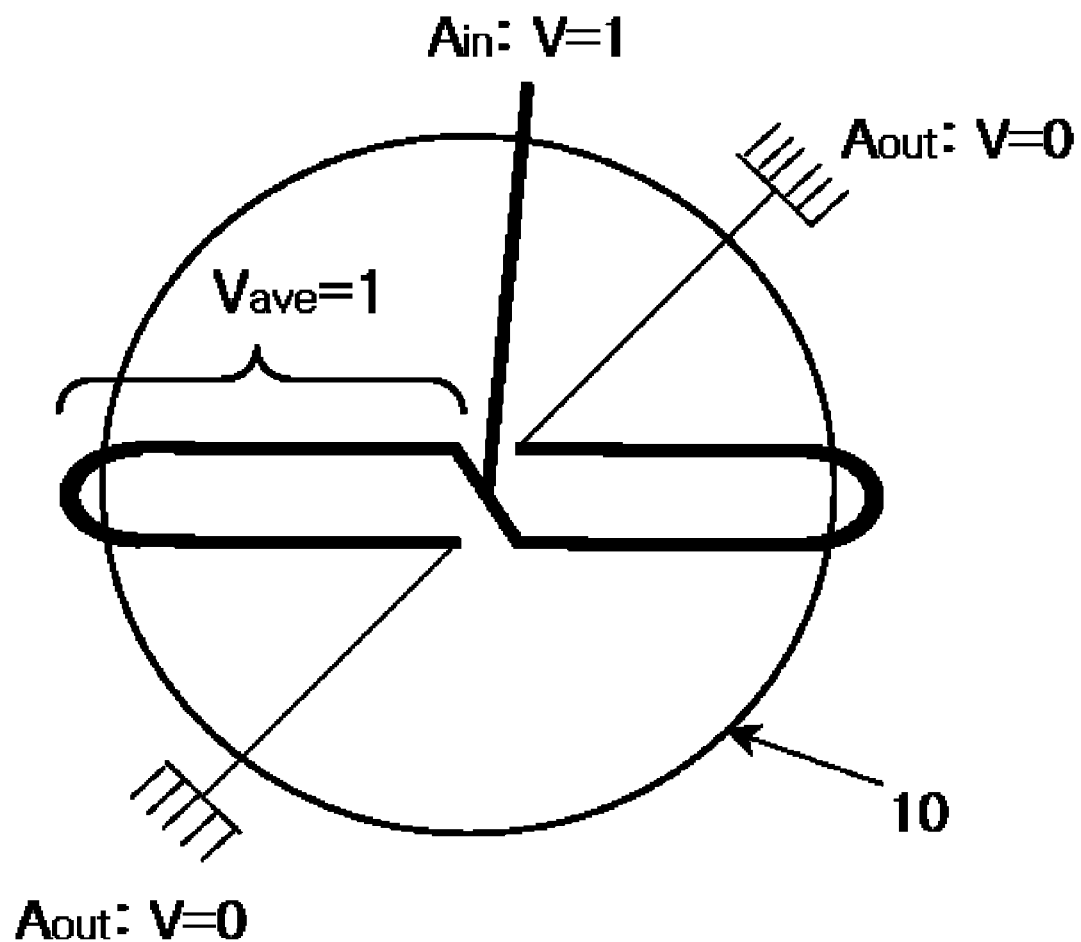
FIG. 5 is a schematic diagram illustrating a rotational antenna in accordance with a further embodiment of the present invention.

FIG. 4 is a schematic diagram illustrating a rotational antenna in accordance with another embodiment of the present invention. FIG. 5 is a schematic diagram illustrating a rotational antenna in accordance with a further embodiment of the present invention. FIG. 4 represents the case in which one branch coil is used, but FIG. 5 represents the case in which two branch coils are connected in parallel. When one branch coil is used, it is not necessary to distinguish serial connection and parallel connection.

If a radio frequency input voltage of 1 is applied during rotation of the antenna to the point $A_{in}$ where the branch coil (s) is connected to the center coil, a voltage drop occurs and the voltage (s) V at the point (s) $A_{out}$ as a grounding point (s) becomes 0. From the standpoint of the substrate 10 as a workpiece placed below the coil (s), there is provided an effect that the average voltage $V_{ave}=1$ is uniformly applied by the branch coil (s) to the substrate 10 along the radial direction. This helps minimize the voltage difference (s) generated in the structure of the rotational antenna.

Figure 6:
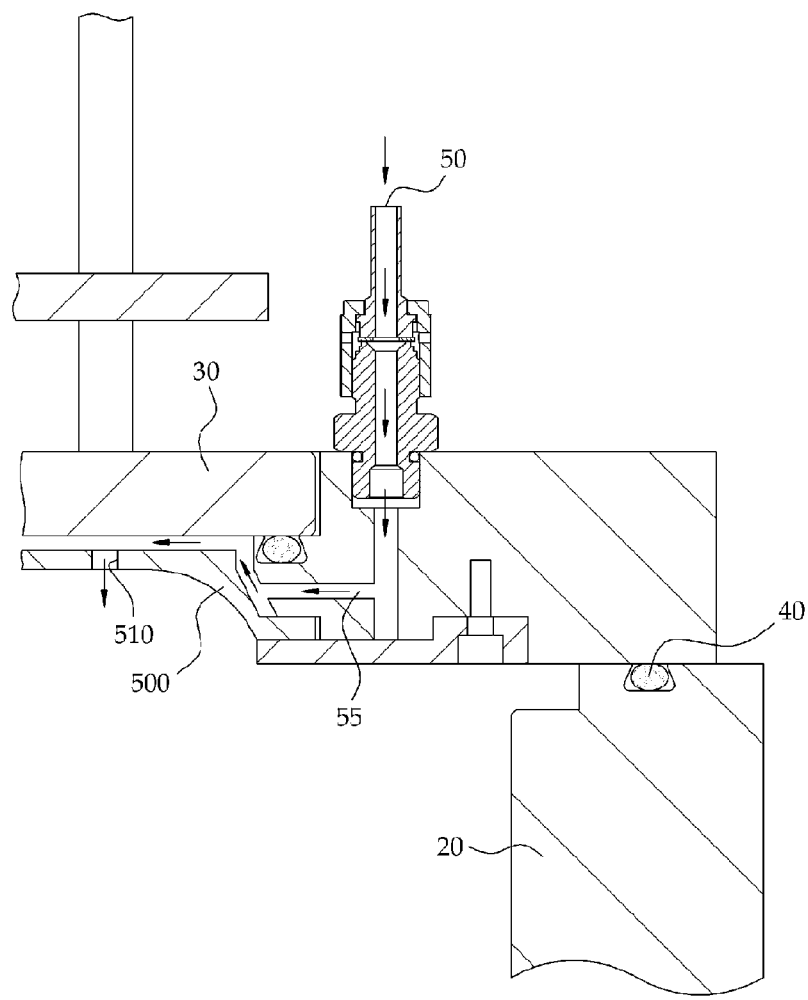
FIG. 6 is a partially enlarged sectional view illustrating a gas supply part of the semi-conductor manufacturing device shown in FIG. 1.
Figure 7:
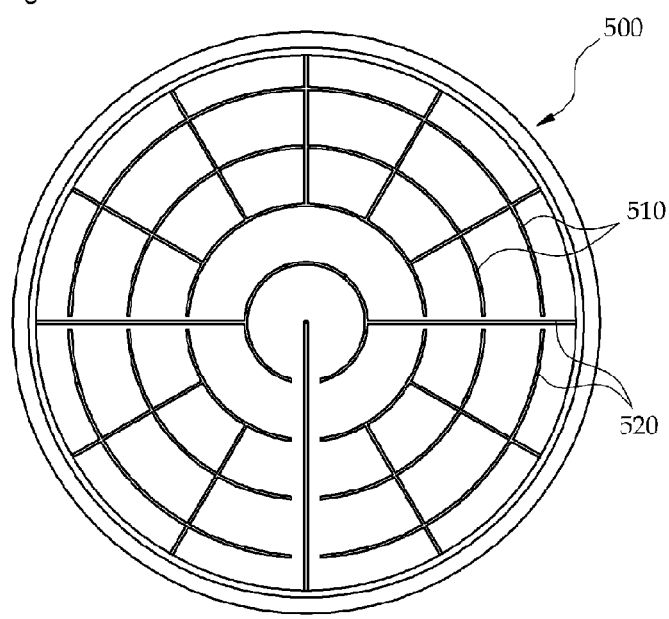
FIG. 7 is a plan view illustrating a gas supply plate according to the present invention.
Figure 8:
FIG. 8 is a front view of the gas supply plate illustrated in FIG. 7.

FIG. 6 is a partially enlarged sectional view illustrating a gas supply part of the semi-conductor manufacturing device shown in FIG. 1. FIG. 7 is a plan view illustrating a gas supply plate 500 according to the present invention. FIG. 8 is a front view of the gas supply part illustrated in FIG. 7. The gas supply plate 500 of the semiconductor manufacturing device according to the present invention will be described in detail with reference to FIGS. 6 through 8.

Referring first to FIG. 6, the reaction gas introduced through the gas inlet 50 defined in the wall of the chamber 20 is supplied into the chamber 20 via the gas channel 55, gas grooves 520 and gas holes 510 which are defined in the gas supply plate 500.

Referring next to FIGS. 7 and 8, the reaction gas evenly dispersed through the gas grooves 520 defined in the circumferential direction and in the radial direction of the gas supply plate 500 is injected into the chamber 20 through the gas holes 510. In the gas grooves 520 and the gas holes 510 finely defined in the gas supply plate 500, the gas pressure is partially high. Therefore, no plasma is generated therein by the electromagnetic field induced by the radio frequency power. Accordingly, plasma is generated only within the chamber 20 and undesired generation of plasma in the gas supply passages is suppressed.

The embodiments shown and described hereinabove should not be construed to limit the scope of protection of the present invention. The scope of the invention shall be limited only by the subject matters recited in the claims. It will be understood by those skilled in the art that various changes and modifications may be made without departing from the scope of the invention defined in the claims.

INDUSTRIAL APPLICABILITY

The rotational antenna in accordance with the present invention can be advantageously used to assure a uniform plasma density distribution in a semiconductor manufacturing device, which in turn is capable of processing a substrate, e.g., a wafer, with reduced costs and increased efficiency.

The invention claimed is:
1. A semiconductor manufacturing device, comprising:
a chamber configured to receive a wafer, and to be supplied with a reaction gas;
a rotational antenna including
a center coil which defines a rotation center axis, and branch coils connected to the center coil;
a rotator; and
a housing, wherein
the center coil is rotatably supported with respect to the chamber,
the center coil and the branch coils, which are connected to each other, are rotatable about the rotation center axis defined by the center coil,
the center coil is rotatably coupled to a high frequency power source which is fixed with respect to the chamber, and the center coil and the branch coils are configured to receive a radio frequency power supplied from the high frequency power source when the center coil and the branch coils are rotating with respect to the chamber and the high frequency power source is fixed with respect to the chamber,
an electromagnetic field, induced by the radio frequency power transmitted through the branch coils which are rotating, is rotated along a circumferential direction of the center coil, when the center coil and the branch coils are rotated about the rotation center axis,
inductively coupled plasma is uniformly formed along the circumferential direction of the center coil, when the center coil and the branch coils are rotated about the rotation center axis,
the center coil is electrically insulated from the rotator,
the center coil is mounted to the rotator with an insulation member interposed between the center coil and the rotator, and the center coil is rotatable together with the rotator,
the rotator assembled with the center coil is rotatably fitted into the housing,
the branch coils have grounding parts at corresponding ends of the branch coils, and the grounding parts are in contact with the rotator and rotatable together with the rotator, and
the grounding parts, while rotating about the rotation center axis when the center coil and the branch coils are rotated about the rotation center axis, are rotatably coupled to the housing through the rotator for electrical grounding.
2. The semiconductor manufacturing device as recited in claim 1, wherein
a power input part, which is connected to the high frequency power source through a slip ring, is provided at an end of the center coil, and
a rotational contact of the power input part with the slip ring is configured to apply the high frequency power supplied from the high frequency power source to the center coil.
3. The semiconductor manufacturing device as recited in claim 1, wherein each of the center coil and the branch coils is formed of a conductor pipe through which a coolant flows, and the coolant is rotated along the circumferential direction of the center coil together with the conductor pipe, when the center coil and the branch coils are rotated about the rotation center axis.

4. The semiconductor manufacturing device as recited in claim 1, further comprising a gas supply plate for uniform injection of the reaction gas,
wherein the gas supply plate is fixed with respect to the chamber, and faces the rotational antenna rotated with respect to the chamber.
5. The semiconductor manufacturing device as recited in claim 1, wherein
a coolant, which enters an inside of the center coil, flows via the center coil to the branch coils connected in parallel to the center coil, and the coolant is then discharged through coolant outlets formed in the grounding parts, and
the grounding parts and the coolant are rotated along the circumferential direction of the center coil, when the center coil and the branch coils are rotated about the rotation center axis.
6. A semiconductor manufacturing device, comprising:
a chamber configured to receive a wafer, and to be supplied with a reaction gas;
a rotational antenna including
a center coil which defines a rotation center axis, and branch coils connected to the center coil;
a rotator; and
a housing, wherein
the center coil is rotatably supported with respect to the chamber,
the center coil and the branch coils, which are connected to each other, are rotatable about the rotation center axis defined by the center coil,
the center coil is rotatably coupled to a high frequency power source which is fixed with respect to the chamber, and the center coil and the branch coils are configured to receive a radio frequency power supplied from the high frequency power source when the center coil and the branch coils are rotating with respect to the chamber and the high frequency power source is fixed with respect to the chamber,
an electromagnetic field, induced by the radio frequency power transmitted through the branch coils which are rotating, is rotated along a circumferential direction of the center coil, when the center coil and the branch coils are rotated about the rotation center axis,
inductively coupled plasma is uniformly formed along the circumferential direction of the center coil, when the center coil and the branch coils are rotated about the rotation center axis,
the rotator is assembled with the center coil and rotatably fitted into the housing,
the housing has a coolant supply part and a coolant discharge part,
the rotator has coolant channels through which a coolant is transferred to an inside of the rotational antenna, and
seals are provided between the coolant supply part and the coolant channels, and between the coolant discharge part and the coolant channels.
7. A semiconductor manufacturing device, comprising:
a chamber configured to receive a wafer, and to be supplied with a reaction gas;
a rotational antenna including
a center coil which defines a rotation center axis, and branch coils connected to the center coil;
a rotator; and
a housing, wherein
the center coil is rotatably supported with respect to the chamber, the center coil and the branch coils, which are connected to each other, are rotatable about the rotation center axis defined by the center coil, the center coil is rotatably coupled to a high frequency power source which is fixed with respect to the chamber, and the center coil and the branch coils are configured to receive a radio frequency power supplied from the high frequency power source when the center coil and the branch coils are rotating with respect to the chamber and the high frequency power source is fixed with respect to the chamber, an electromagnetic field, induced by the radio frequency power transmitted through the branch coils which are rotating, is rotated along a circumferential direction of the center coil, when the center coil and the branch coils are rotated about the rotation center axis, inductively coupled plasma is uniformly formed along the circumferential direction of the center coil, when the center coil and the branch coils are rotated about the rotation center axis, the branch coils have grounding parts at corresponding ends of the branch coils, and the center coil is mounted to the rotator, the housing, into which the center coil is rotatably fitted, is fixed with respect to the chamber, and the grounding parts are connected to the rotator, a coolant, which enters the housing fixed with respect to the chamber, flows via a groove to an inside of the center coil, the groove formed between rotational contact surfaces of the housing and the rotator, and at least a part of the coolant is rotated along the circumferential direction of the center coil, when the center coil and the branch coils are rotated about the rotation center axis.

* * * * *